United States Patent
Schaller et al.

(10) Patent No.: US 11,764,539 B2
(45) Date of Patent: Sep. 19, 2023

(54) TRANSMITTING DEVICE FOR A LIDAR SCANNER HAVING A SCANNING MIRROR COVERED BY A COVER ELEMENT

(71) Applicant: JENOPTIK Optical Systems GmbH, Jena (DE)

(72) Inventors: Uwe Schaller, Kahla (DE); Christian Raabe, Jena (DE)

(73) Assignee: JENOPTIK OPTICAL SYSTEMS GMBH, Jena (DE)

( * ) Notice: Subject to any disclaimer, the term of this patent is extended or adjusted under 35 U.S.C. 154(b) by 692 days.

(21) Appl. No.: 16/640,667

(22) PCT Filed: Aug. 2, 2018

(86) PCT No.: PCT/DE2018/100681
§ 371 (c)(1),
(2) Date: Feb. 20, 2020

(87) PCT Pub. No.: WO2019/037809
PCT Pub. Date: Feb. 28, 2019

(65) Prior Publication Data
US 2020/0355801 A1    Nov. 12, 2020

(30) Foreign Application Priority Data

Aug. 21, 2017  (DE) .................... 20 2017 105 001.7
Oct. 13, 2017  (DE) .................... 10 2017 123 875.1

(51) Int. Cl.
*H01S 5/00*      (2006.01)
*G01S 7/481*    (2006.01)
(Continued)

(52) U.S. Cl.
CPC .......... *H01S 5/0071* (2013.01); *B81B 7/0067* (2013.01); *G01S 7/4815* (2013.01);
(Continued)

(58) Field of Classification Search
None
See application file for complete search history.

(56) References Cited

U.S. PATENT DOCUMENTS 3,899,145 A  *  8/1975  Stephenson ........... G01S 7/4812
                                                                244/3.13
5,321,489 A       6/1994  Defour et al.
2015/0301182 A1* 10/2015  Geiger .................... G01S 17/04
                                                                250/201.1

FOREIGN PATENT DOCUMENTS

DE    102011006159 A1    9/2012
DE    102012025281 A1    6/2014
(Continued)

OTHER PUBLICATIONS

International Search Report from PCT/DE2018/100681, filed Aug. 2, 2018, dated Nov. 9, 2018.

*Primary Examiner* — Hung K Vu
(74) *Attorney, Agent, or Firm* — Patentbar International

(57) ABSTRACT

A transmitting device, containing an emitting device (1) and a scanning mirror (2), which is deflectable about its center (MP) and is arranged in a housing (3) with a transparent cover element (4). The cover element (4) is formed, at least in a coupling-out region (4.2), by a section of a monocentric hemispherical shell (HK) with a center of curvature (K) and is arranged to cover the scanning mirror (2) in such a way that the center of curvature (K) of the hemispherical shell (HK) and the center (MP) of the scanning mirror (2) coincide.

10 Claims, 6 Drawing Sheets

(51) Int. Cl.
    *G01S 17/42*     (2006.01)
    *G02B 26/08*     (2006.01)
    *G01S 7/4911*     (2020.01)
    *G01S 17/02*     (2020.01)
    *G02B 26/10*     (2006.01)
    *H01S 5/02255*     (2021.01)
    *B81B 7/00*     (2006.01)

(52) U.S. Cl.
    CPC ............ *G01S 7/4817* (2013.01); *G01S 7/4911* (2013.01); *G01S 17/02* (2013.01); *G01S 17/42* (2013.01); *G02B 26/0816* (2013.01); *G02B 26/0833* (2013.01); *G02B 26/10* (2013.01); *H01S 5/02255* (2021.01); *G01S 7/4813* (2013.01); *H01S 5/005* (2013.01)

(56) References Cited

FOREIGN PATENT DOCUMENTS

| | | |
|---|---|---|
| EP | 0731417 A2 | 9/1996 |
| EP | 1480006 A2 | 11/2004 |
| JP | S58192015 A | 11/1983 |
| JP | 2003021801 A | 1/2003 |
| JP | 2009116151 A | 5/2009 |
| JP | 2014186136 A | 10/2014 |
| JP | 2016033529 A * | 3/2016 |

* cited by examiner

TRANSMITTING DEVICE FOR A LIDAR SCANNER HAVING A SCANNING MIRROR COVERED BY A COVER ELEMENT

RELATED APPLICATIONS

This application is a National Phase Application of International Application PCT/DE2018/100681, filed on Aug. 2, 2018, which in turn claims priority to German Patent Applications DE 20 2017 105 001.7, filed Aug. 21, 2017 and DE 10 2017 123 875.1, filed Oct. 13, 2017, all of which are incorporated herein by reference in their entirety.

FIELD OF THE INVENTION

The invention relates to a transmitting device for a LIDAR scanner which uses collimated laser radiation to scan at least one scan angle range.

In distance measurement, in which individual scan points are imaged quasi to infinity, the individual scan angle ranges have a three-dimensional extension by scanning a two-dimensional scan field or a two-dimensional extension by scanning a one-dimensional scan line.

While the extent of the scan field or scan line is limited by the maximum deflection angle of the scanning mirror, its depth is basically determined on the one hand by the Beer-Lambert law, according to which the intensity of the radiation decreases exponentially with the path of travel, and on the other hand by the required laser class, which limits the power of the radiation source.

Large scan angle ranges are of interest, for example, where a large spatial area is to be monitored without interruption. Areas of application can be e.g. aviation, shipping, military technology or autonomous driving of road vehicles.

When using a rotating mirror as a scanning mirror by which large scan angles can be covered, further discrete components such as holders in which the mirror axis is supported are required. The friction generated by the rotation leads to wear and the resulting slippage. In addition, assemblies made of discrete components are nowadays generally more complex to manufacture and therefore more expensive than monolithic assemblies. They are also less easy to miniaturize and tend to be heavier.

MEMS (micro-electro-mechanical system) mirrors, which are monolithically connected to a frame via flexure hinges, operate completely wear-free, with two flexure hinges arranged around the center of the MEMS mirror offset from each other by 180° forming an axis of rotation when viewed mechanically. There are commercially available MEMS mirrors that can only be deflected around one axis of rotation, around two axes of rotation that are perpendicular to each other, or around three or more joints that form individual suspensions. The deflection angle of the MEMS mirror relative to the frame is limited to approx. +/−10° around an undeflected zero position due to the flexure hinge connection. The frictionless operation, its high achievable operating frequency and the meanwhile comparatively low price make MEMS mirrors very attractive especially for dynamic, compact and robust devices.

When using MEMS mirrors as scanning mirrors for a transmitting device, however, the limited, small deflection angle is a disadvantage. The maximum scan angle range for a laser beam reflected by the MEMS mirror is four times the maximum deflection angle and is therefore no more than approx. 40°. It would be obvious to use multiple MEMS mirrors to achieve a larger combined scan angle range from the scan angle ranges of the individual MEMS mirrors or to create multiple scan angle ranges that are spaced apart. On the one hand, however, this would compromise the compactness of the device and, on the other hand, technical measures would have to be taken to synchronize the movement of the MEMS mirrors. Directing several laser beams at different angles of incidence onto a MEMS mirror instead, so that they scan several contiguous individual scan angle ranges that join together to form a large scan angle range, would have the disadvantage that a cover element placed in front of the MEMS mirror, which is known from the prior art only in the form of a planar plate, would influence the individual laser beams differently.

Regardless of whether the scanning mirror is a MEMS mirror or not, there may be reasons why the scanning mirror is enclosed in a housing and covered by a cover element and thus protected. As far as is known, the cover element is always a transparent planar plate arranged parallel or inclined to the undeflected mirror.

A laser beam impinging on the cover element, which may optionally also relate to several laser beams directed at the scanning mirror, and each of the laser beams after reflection on the scanning mirror, consequently undergoes more or less Fresnel losses, depending on the angle of incidence on the planar plate, which more or less reduce the intensity of the laser beam depending on the location. In addition, undesired reflections may occur on the cover element.

BACKGROUND OF THE INVENTION

DE 10 2012 025 281 A1 discloses an optical object detection unit with a transmitting unit is known, which contains a transmitter for emitting a laser beam, a micromirror which can be pivoted about its center in one or two pivoting directions and a transmitter lens which is arranged downstream of the micromirror in the transmission beam path, covering it. The transmitter lens, designed as a meniscus lens, can also function here as a cover for a housing of the transmitting unit. A disadvantage here is that the micromirror cannot be housed on its own, since the laser beam cannot be guided towards the micromirror via the transmitter lens.

DE 10 2011 006 159 A1 discloses a projection device comprising an MEMS mirror that can be swiveled into at least two switching positions and is covered by a gradient index lens. The gradient index lens is a very positive refractive plano-convex lens or a very positively refractive meniscus, respectively, whose planar or concave surface, respectively, is arranged facing the MEMS mirror. A presumably parallel laser beam incident through the gradient index lens is focused on the MEMS mirror and, after reflection, is collimated again if necessary when passing through the gradient index lens again. One disadvantage is that the MEMS mirror, limited by the planar surface of the gradient index lens, has only a very small swivel range, and the other is that laser beams that may come from different angles of incidence do not impinge on the MEMS mirror at the same point due to refraction at the planar or concave surface, respectively, of the gradient index lens.

SUMMARY OF THE INVENTION

It is the object of the invention to find a transmitting device for a LIDAR scanner, comprising a scanning mirror protected by a cover element, wherein only low Fresnel losses, if any, and no undesired reflections occur at the cover element.

The object of the invention is achieved by the features of claim 1. Advantageous embodiments are set forth in the subclaims which refer back to claim 1.

The invention will be explained in more detail below with reference to exemplary embodiments and drawings.

DETAILED DESCRIPTION OF THE PREFERRED EMBODIMENTS

Figure 1:
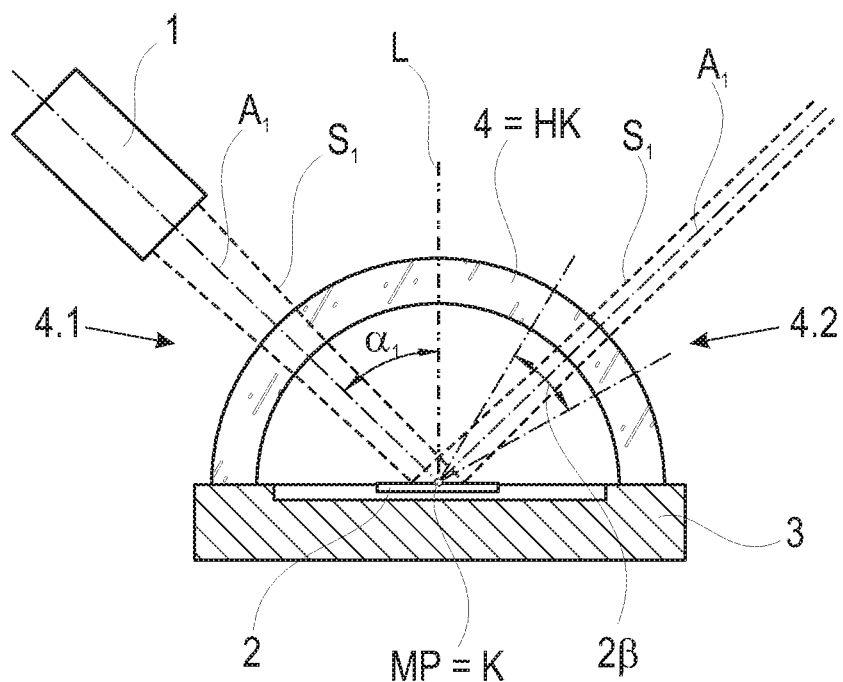
FIG. 1 shows a first exemplary embodiment of a transmitting device comprising an emitting device which emits a pre-collimated laser beam.
Figure 2:
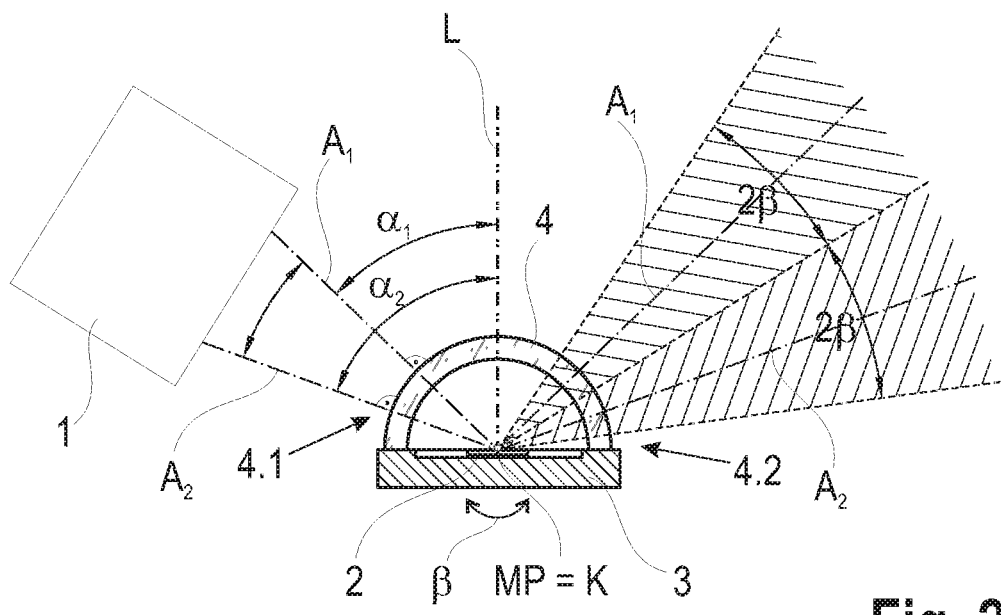
FIG. 2 shows a second exemplary embodiment of a transmitting device comprising an emitting device which emits two pre-collimated laser beams enclosing an angle with each other.
Figure 4A:
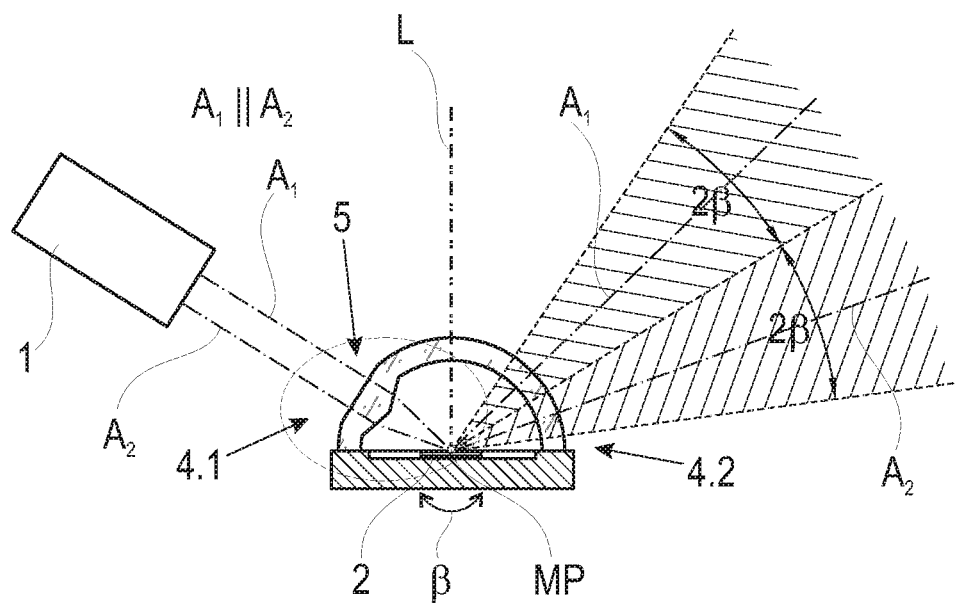
FIG. 4A shows a third exemplary embodiment of a transmitting device comprising an emitting device which emits two pre-collimated, parallel laser beams.

A transmitting device according to the invention basically comprises, as shown in FIG. 1, FIG. 2 or FIG. 4A, an emitting device 1, which emits at least one laser beam $S_1, \ldots, S_n$ with a beam axis $A_1, \ldots, A_n$, and a scanning mirror 2, which can be deflected about its center MP by a deflection angle β. The scanning mirror 2 is arranged in a housing 3 with a transparent cover element 4. The beam axis $A_1, \ldots, A_n$ of the at least one laser beam $S_1, \ldots, S_n$ is directed at the cover element 4 in such a way that, after the at least one laser beam $S_1, \ldots, S_n$ has passed through the cover element 4 within a coupling-in region 4.1, it impinges on the center MP of the scanning mirror 2. After reflection of the at least one laser beam $S_1, \ldots, S_n$ at the scanning mirror 2, it passes once again through the cover element 4 within a coupling-out region 4.2.

It is essential to the invention that the cover element 4 is formed, at least in the coupling-out region 4.2, by a section of a monocentric hemispherical shell HK (hereinafter referred to only as hemispherical shell HK) and is arranged to cover the scanning mirror 2 in such a way that the center of curvature K of the hemispherical shell HK and the center MP of the scanning mirror 2 coincide. Monocentric means that the centers of curvature of the two surfaces of the hemispherical shell HK coincide.

The cover element 4 only has the function of protecting the scanning mirror 2 while avoiding undesired optical effects. As it is designed as a section of a monocentric hemispherical shell HK at least in the radiation area, it has an equal effect on each laser beam $S_1, \ldots, S_n$ reflected from the center MP of the scanning mirror 2 into the radiation area. The principal ray of each laser beam $S_1, \ldots, S_n$, which is directed onto the center MP of the scanning mirror 2, is reflected vertically onto the two surfaces of the hemispherical shell HK and therefore passes unrefracted through the cover element 4. Since the hemispherical shell HK necessarily has a certain thickness, all other rays of the laser beam $S_1, \ldots, S_n$ (correctly one would have to speak of a laser ray bundle) are inevitably refracted at the boundary surfaces, with the hemispherical shell HK acting as a diverging lens. The unavoidable optical effect of the hemispherical shell HK is compensated by the emitting device 1 directing the laser beam $S_1, \ldots, S_n$, already pre-collimated, onto the cover element 4. Here, pre-collimated means that the laser beam $S_1, \ldots, S_n$ exhibits little convergence. Due to the diverging effect of the hemispherical shell HK, the laser beam $S_1, \ldots, S_n$ is completely collimated.

The cover element 4 may be a complete hemispherical shell HK, see FIG. 1, it may be a hemispherical shell HK, in which a deflecting element 5 is integrated or formed in the coupling-in region 4.1, see FIG. 4A, to the extent that the hemispherical shell HK is reduced to a section encompassing the coupling-out region 4.2 and constitutes, in the coupling-in region, a planar plate arranged parallel or inclined to the undeflected scanning mirror. In principle, the cover element 4 can also be formed in the coupling-in region 4.1 and in the coupling-out region 4.2 by sections of two hemispherical shells with a different radius, with the centers of curvature of both hemispherical shells coinciding with the center MP of the scanning mirror. For the following description of the invention, it will be assumed for the sake of simplicity that, in the case that both the coupling-in region 4.1 and the coupling-out region 4.2 are formed by a section of a hemispherical shell, the cover element itself is a complete hemispherical shell. The hemispherical shell HK has a negative refractive power. It is defined by a geometric base circle described by the perimeter of the base of the hemispherical shell HK and has an area center. The area center simultaneously represents the center of curvature K of the hemispherical shell HK and of all sections of this hemispherical shell HK. This means that if the hemispherical shell HK is reduced to a section, the same center of curvature K can be assigned to this section as to an imaginary assigned complete hemispherical shell HK.

The different effects of the different embodiments of the coupling-in region 4.1 will be explained later with reference to the exemplary embodiments.

The cover element 4 must absolutely be arranged to cover the scanning mirror 2 in such a way that the center of the geometric base circle G on the scanning mirror 2 lies at its center MP. Manufacturing and assembly-related tolerances, long-term drifts as well as tolerance deviations which allow for an expected deterioration in beam quality are also included.

It is also essential to the invention that the at least one laser beam $S_1, \ldots, S_n$ is convergingly pre-collimated before it passes through the cover element 4 within the coupling-in region 1 and is fully collimated within the coupling-out region after passing through the cover element 4 again.

Knowing the radiation characteristics of a laser source, e.g. a laser diode, it is expert skill to calculate a collimator, which together with the laser source forms the emitting device 1 for a laser beam, matching the optical parameters of the cover element 4 in such a way that the laser beam $S_1, \ldots, S_n$ emitted by the transmitting device is completely collimated. The emitting device 1 has a number of laser sources 1.1 and collimators 1.2 depending on how many laser beams $S_1, \ldots, S_n$ it emits. The laser sources 1.1 are located close to, but not exactly in the object-side focal point $F_{1.2}$ of the associated collimator 1.2, so that the laser beams $S_1, \ldots, S_n$ are not yet completely collimated as they emerge from the emitting device 1.

FIG. 1 shows a first exemplary embodiment of a transmitting device. Here, the emitting device 1 emits exactly one laser beam $S_1$. In a second exemplary embodiment, shown in FIG. 2, the emitting device 1 emits two laser beams $S_1$, $S_2$. The emitting device 1 may also emit more than two laser beams $(S_1, \ldots, S_n)$, whose beam axes $(A_1, \ldots, A_n)$ are each directed perpendicular to the surface in the coupling-in region (4.1) and enclose an angle with each other.

The design of the cover element 4 is the same for both exemplary embodiments and represents a complete hemispherical shell HK, so that the coupling-in region 4.1. and the coupling-out region 4.2. of the cover element 4 each comprise a section of this monocentric hemispherical shell HK. In this way the cover element 4 is comparatively easy to produce. However, outside of the coupling-in region 4.1 and the coupling-out region 4.2, the cover element 4 can basically have any geometric shape.

Completely independent of an angle of incidence $\alpha_1, \ldots, \alpha_n$, at which the at least one laser beam $S_1, \ldots, S_n$ impinges on the scanning mirror 4'. with respect to the perpendicular L of the undeflected scanning mirror 42, the beam axis $A_1, \ldots, A_n$ after reflection on the scanning mirror 42, regardless of its position during the deflection, always impinges on the cover element 4 perpendicularly if the cover element 4 is provided as a hemispherical shell HK or represents a section of the hemispherical shell HK at least in the coupling-in and coupling-out regions 4.1, 4.2. Thus, the transmitted part of the passing laser beam $S_1, \ldots, S_n$ is not only as large as possible, but is also not subject to fluctuations when the scanning mirror 42 is deflected.

Advantageously, the hemispherical shell 4.2 is produced with a robust wall thickness, e.g. by injection molding. Due to its wall thickness it then also has a considerable beam-shaping effect.

Figure 3:
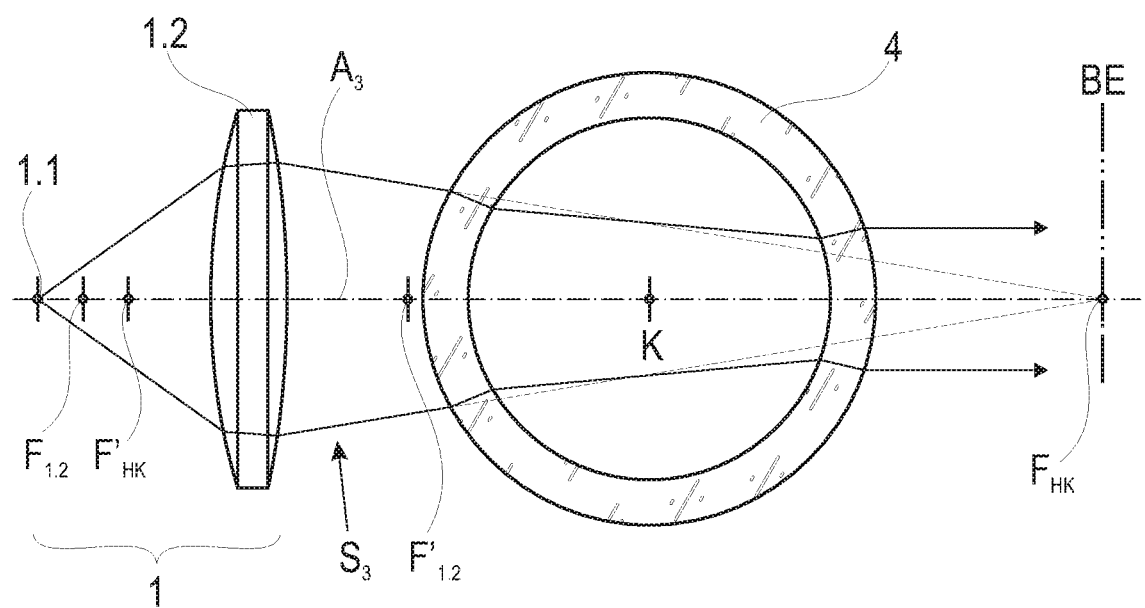
FIG. 3 shows a simplified optics diagram for the beam path of a laser beam in a transmitting device according to FIG. 1 or 2.

FIG. 3 shows a simplified unfolded optics diagram for the beam path of the laser beams $S_1, \ldots, S_n$ by means of a laser beam $S_3$ for the first and second exemplary embodiments of a transmitting device. Here, unfolded means that a beam deflection due to the reflection at the scanning mirror 2 will be disregarded. A pre-collimated laser beam $S_3$ coming from the emitting device 1 is completely collimated by passing twice through the hemispherical shell HK, which has a negative refractive power $F_{HK}$, $F'_{HK}$ Complete collimation for the laser beam $S_3$ is achieved by designing the collimator 1.2 in such a way that the laser beam source 1.1 is imaged via the collimator 1.2 into an image plane BE passing through the location of the object-side focal point $F_{HK}$ of the hemispherical shell HK.

Figure 4B:
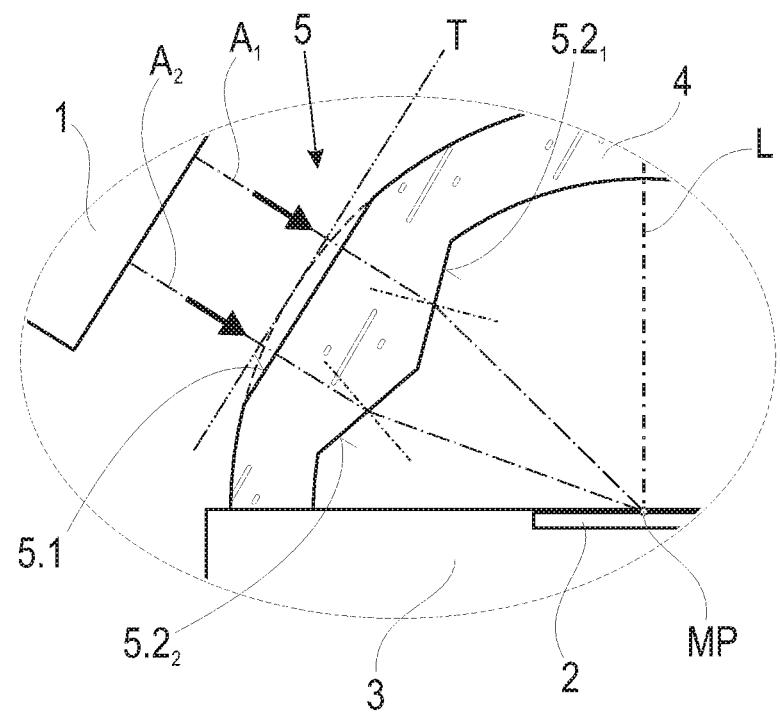
FIG. 4B shows an enlarged partial representation of a transmitting device according to FIG. 4A.

FIG. 4A shows a schematic diagram for a third exemplary embodiment of a transmitting device, an enlarged section of which in FIG. 4B shows the deflecting element FIG. 5 to FIG. 8 show respective deflecting elements 45 of different designs for further exemplary embodiments. These exemplary embodiments differ from the first two exemplary embodiments mentioned in that the emitting device 1 emits at least two laser beams $S_1, \ldots, S_n$, with beam axes $A_1, \ldots, A_n$ aligned parallel to each other and that the cover element 4 comprises a deflecting element 5 in the coupling-in region 4.1 or is designed as such a deflecting element, via which the at least two laser beams $S_1, \ldots, S_n$ are directed at the center MP.

Figure 5:
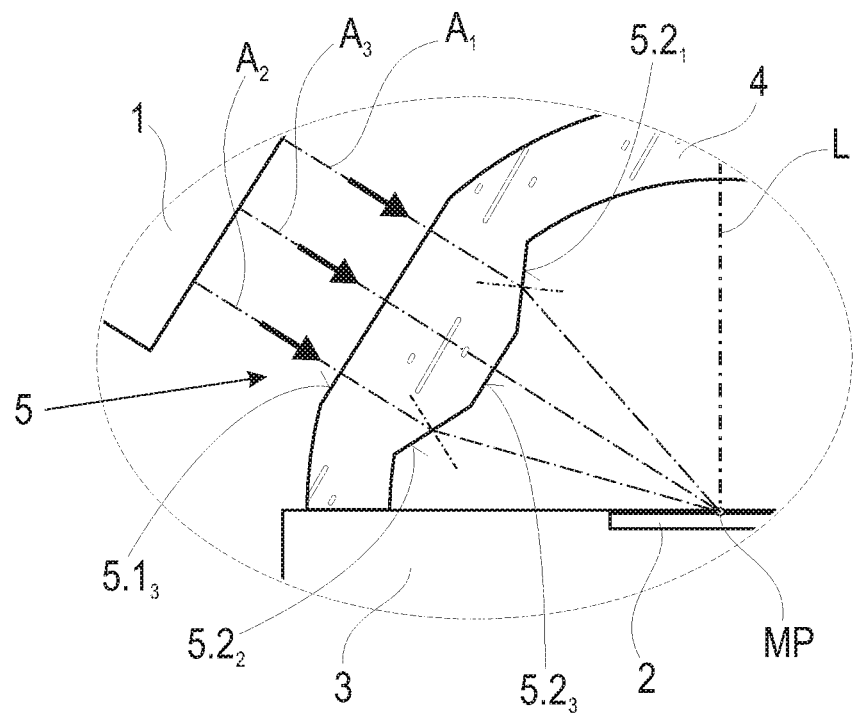
FIG. 5 shows an enlarged partial representation of a fourth exemplary embodiment of a transmitting device comprising an emitting device which emits three pre-collimated, parallel laser beams along a row.

According to the third exemplary embodiment of FIG. 4A and FIG. 4B and the fourth exemplary embodiment of FIG. 5, the deflecting element 5 has a planar entrance surface $5.1_3$, which is arranged in an imaginary tangential plane T or parallel to an imaginary tangential plane T of the hemispherical shell HK and has an equal number of planar, mutually inclined exit surfaces $5.2_1, \ldots, 5.2_n$, as the emitting device 1 emits laser beams S $S_n$, so that the at least two parallel laser beams $S_1, \ldots, S_n$, with the exception of one of the laser beams $S_1, \ldots, S_n$, when aligned perpendicularly to the entrance surface $5.1_3$, are each directed at the center MP via refraction at the exit surfaces $5.2_1, \ldots, 5.2_n$.

The emitting device 1 advantageously emits an odd number of laser beams $S_1, \ldots, S_n$, as shown in the fourth exemplary embodiment in FIG. 5, and the exit surfaces $5.2_1, \ldots, 5.2_n$ are arranged in a row, where a middle one of the exit surfaces $5.2_1, \ldots, 5.2_n$ is parallel to the one entrance surface $5.1_3$ and the further ones of the exit surfaces $5.2_1, \ldots, 5.2_n$ are arranged symmetrically to the middle one of the exit surfaces $5.2_1, \ldots, 5.2_n$, so that two of the further ones of the exit surfaces $5.2_1, \ldots, 5.2_n$ are symmetrically opposite each other and each enclose an equal angle with the middle one of the exit surfaces $5.2_1, \ldots, 5.2_n$.

Figure 6:
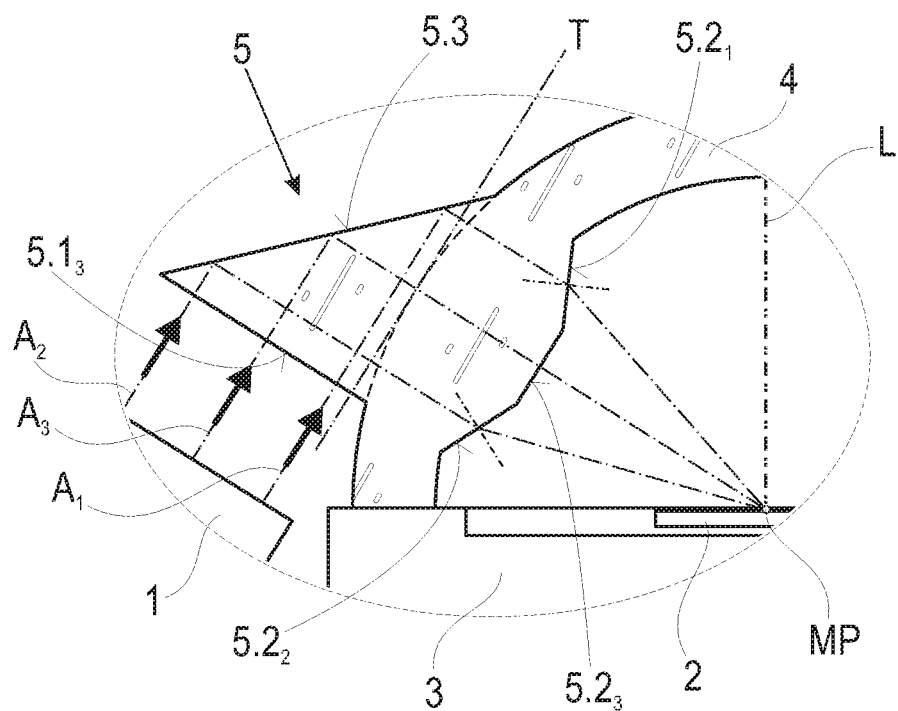
FIG. 6 shows an enlarged partial representation of a fifth exemplary embodiment of a transmitting device comprising an emitting device which emits three pre-collimated, parallel laser beams along a row.

A fifth exemplary embodiment, shown in FIG. 6, differs from the third and fourth exemplary embodiments in that the one planar entry surface $5.1_3$ is arranged perpendicular to an imaginary tangential plane T of the hemispherical shell HK and has a rear surface 5.3, which is inclined to the entry surface 5.1 by 45°, so that the at least two laser beams $S_1, \ldots, S_n$ are reflected by the rear surface 5.3 when their beam axes $A_1, \ldots, A_n$ are perpendicularly aligned with the entrance surface $5.1_3$, and are each directed at the center MP via refraction at the exit surfaces $5.2_1, \ldots, 5.2_n$.

The one entrance surface $5.1_3$ may also enclose another angle with the imaginary tangential plane T, between 0° and 90°, so that the emitting device 1 can be arranged in its relative position to the scanning mirror 2 depending on the given constructional freedom.

Figure 7:
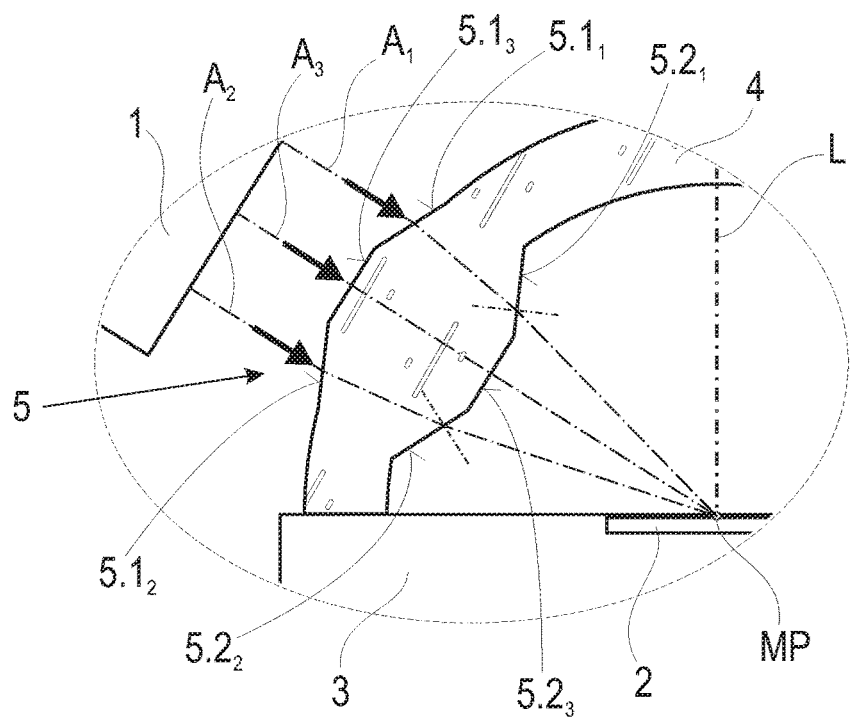
FIG. 7 shows an enlarged partial representation of a sixth exemplary embodiment of a transmitting device comprising an emitting device which emits three pre-collimated, parallel laser beams along a row.

The sixth exemplary embodiment shown in FIG. 7 differs from the third to fifth exemplary embodiments in that the deflecting element 5 has an equal number of entrance surfaces $5.1_1, \ldots, 5.1_n$ as the emitting device 1 emits laser beams $S_1, \ldots, S_n$.

Figure 8:
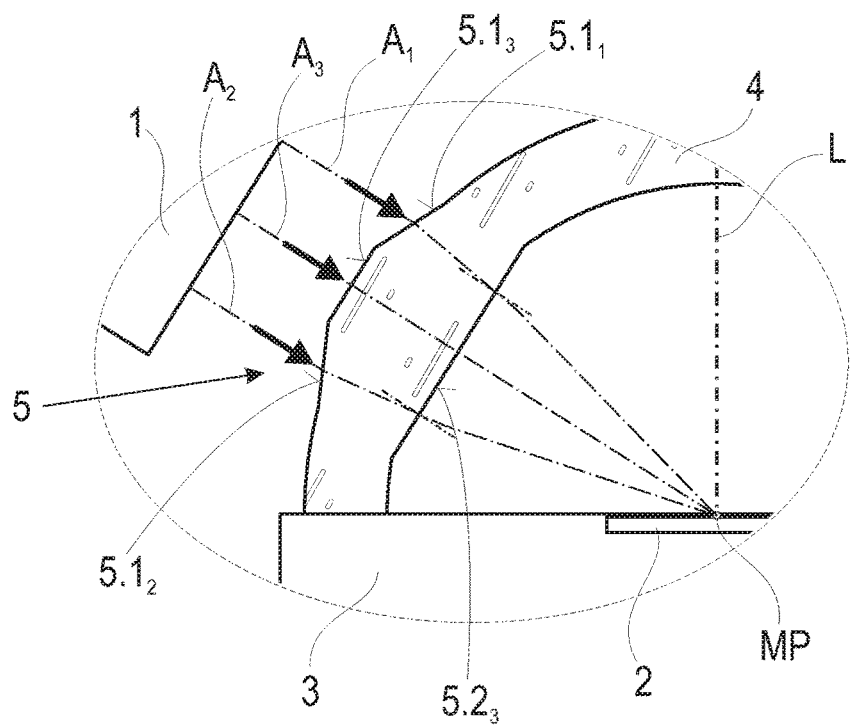
FIG. 8 shows an enlarged partial representation of a seventh exemplary embodiment of a transmitting device comprising an emitting device which emits three pre-collimated, parallel laser beams along a row.

The seventh exemplary embodiment shown in FIG. 8 differs from the sixth exemplary embodiment in that the deflecting element 5 has only one exit surface $5.2_3$.

The latter two embodiments of a deflecting element 5 are particularly advantageous, since the refraction for the laser beams $S_1, \ldots, S_n$ can be divided up between two surfaces.

All the aforementioned embodiments of the deflecting element 5 form a wedge for each of the individual laser beams $S_1, \ldots, S_n$, in that the respectively assigned entrance surface $5.1_1, \ldots, 5.1n$ and the respectively assigned exit surface $5.1_1, \ldots, 5.2n$ are inclined with respect to each other. For one of the laser beams $S_3$ the deflecting element may be a planar plate with the entrance surface $5.1_3$ parallel to the exit surface $5.2_3$.

Figure 9:
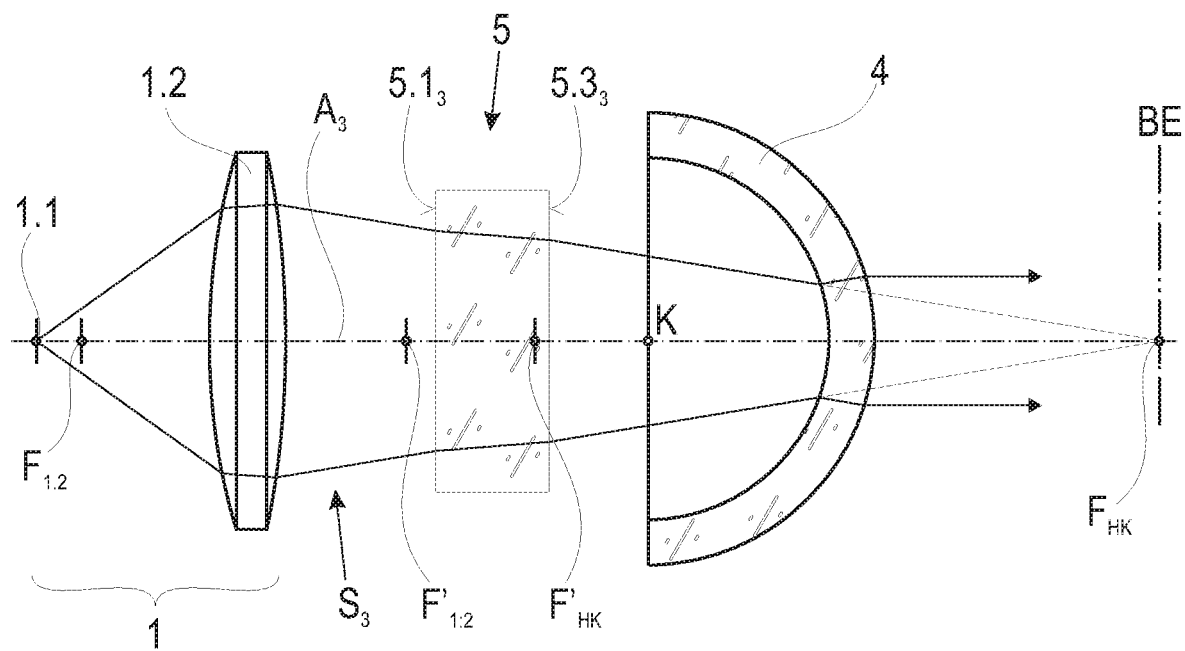
FIG. 9 shows a simplified optics diagram for the beam path of a laser beam in a transmitting device according to FIG. 4A to FIG. 8.

FIG. 9 shows a simplified unfolded optics diagram for the beam path of the laser beams $S_1, \ldots, S_n$ by means of a laser beam $S_3$ for the third to seventh exemplary embodiments. Unfolded means here that the beam deflection by reflection at the scanning mirror 2 and by refraction, or by refraction and reflection in the deflecting element 5 is ignored. A pre-collimated laser beam $S_1, \ldots, S_n$ coming from the emitting device 1 is refracted differently depending on the inclination of its beam axis $A_1, \ldots, A_n$ when passing through the deflecting element 5 and thus deflected. FIG. 9 shows as an example the beam path of the laser beam $S_3$, for which the deflecting element 5 only acts as a planar plate. The deflecting element 5 has no imaging effect, so that complete collimation of the pre-collimated laser beam is achieved by simple imaging via the hemispherical shell HK.

Complete collimation for the laser beam $S_3$ is then achieved by designing the collimator 1.2 in such a way that the laser beam source 1.1 is imaged via the collimator 1.2 and the deflecting element 5 into an image plane BE passing through the location of the object-side focal point $F_{HK}$ of the hemispherical shell HK.

The deflecting element 5 may be inserted as a discretely manufactured component into the cover element 4 or is advantageously monolithically formed in the cover element 4.

The first and second exemplary embodiments pertain to a first type of transmitting device according to the invention, in which, in contrast to a second type, an identical cover element 4 can be used regardless of the number of laser beams and the angle they enclose with one another.

The third, fourth and fifth exemplary embodiments pertain to the second type of a transmitting device according to the invention. In contrast to the first type, 1 commercially available laser diode arrays, in which all laser diode elements emit in the same direction, can be used for the emitting device 1.

LIST OF REFERENCE NUMERALS 1 emitting device
1.1 laser beam source
1.2 collimator
2 scanning mirror
3 housing
4 cover element
4.1 coupling-in region (of the cover element 4)
4.2 coupling-out region (of the cover element 4)
5 deflecting element
$5.1_1, \ldots, 5.1_n$ entrance surface (of the deflecting element 5)
$5.2_1, \ldots, 5.2_n$ exit surface (of the deflecting element 5)
5.3 rear surface (of the deflecting element 5)
$S_1, \ldots, S_n$ laser beam
$A_1, \ldots, A_n$ beam axis (of the laser beam $S_1, \ldots, S_n$)
MP center (of the scanning mirror 2)
T imaginary tangential plane
L perpendicular
HK monocentric hemispherical shell
K center of curvature (of the monocentric hemispherical shell HK)
$\alpha_1, \ldots, \alpha_n$ angle of incidence
β deflection angle (of the scanning mirror 2)
$F_{1.2}$ object-side focal point of the collimator
$F'_{1.2}$ image-side focal point of the collimator
BE image plane
$F_{HK}$ object-side focal point of the hemispherical shell
$F'_{HK}$ image-side focal point of the hemispherical shell

What is claimed is:

1. A transmitting device comprising:
   a housing with a transparent cover element;
   a scanning mirror capable of being deflected about its center (MP) and arranged inside the housing;
   an emitting device serving to emit at least one laser beam with a beam axis directed at the cover element in such a way that the at least one laser beam impinges on the center (MP) after passing through the cover element within a coupling-in region, and the at least one laser beam passes through the cover element again within a coupling-out region after being reflected at the scanning mirror;
   the transparent cover element at least in the coupling-out region is formed, by a section of a monocentric hemispherical shell (HK) having a center of curvature (K) and a wall thickness with a beam-shaping effect and is arranged to cover the scanning mirror in such a way that the center of curvature (K) and the center (MP) of the scanning mirror coincide, so that the cover element has an equal beam-shaping effect on each laser beam ($S_1, \ldots, S_n$) reflected from the center (MP) of the scanning mirror into the coupling-out region, and
   the at least one laser beam ($S_1, \ldots, S_n$) is convergingly pre-collimated before passing through the cover element within the coupling-in region and is fully collimated within the coupling-out region after passing through the cover element again by imaging a laser beam source into an image plane (BE) passing through an object-side focal point ($F_{HK}$) of the hemispherical shell.

2. The transmitting device according to claim 1, wherein the cover element is formed in the coupling-in region by a second section of the monocentric hemispherical shell (HK) or a section of a further monocentric hemispherical shell, and wherein the center of curvature (K) of the monocentric hemispherical shell (HK) and the center of curvature of the further monocentric hemispherical shell coincide.

3. The transmitting device according to claim 2, wherein the cover element is the monocentric hemispherical shell (HK).

4. The transmitting device according to claim 2, wherein the emitting device emits at least two laser beams with respective beam axes aligned with each other so as to enclose an angle with each other, and wherein the at least two laser beams are each directed perpendicularly to a surface of the cover element in the coupling-in region.

5. The transmitting device according to claim 1, further comprising a deflecting element arranged or formed in the cover element in the coupling-in region, wherein the at least one laser beam is directed at the center (MP) via the deflecting element.

6. The transmitting device according to claim 5, wherein the emitting device emits at least two laser beams with parallel beam axes and wherein the deflecting element has a planar entrance surface being arranged in an imaginary tangential plane (T) or in parallel to an imaginary tangential plane (T) of the monocentric hemispherical shell (HK) and has an equal number of planar mutually inclined exit surfaces as the emitting device emits laser beams, so that the at least two laser beams are each directed at the center (MP) via refraction at the exit surfaces when the at least two laser beams are aligned perpendicularly to the entrance surface.

7. The transmitting device according to claim 6, wherein the emitting device emits an odd number of laser beams, the exit surfaces are arranged in a row, a middle one of the exit surfaces being parallel to the entrance surface (5.1) and further ones of the exit surfaces being arranged symmetrically to the middle one of the exit surfaces, so that two of the further ones of the exit surfaces are disposed symmetrically opposite of each other and each enclose an equal angle with the middle one of the exit surfaces.

8. The transmitting device according to claim 5, wherein the emitting device (1) emits at least two laser beams with parallel beam axes and wherein the deflecting element has a planar exit surface being arranged in an imaginary tangential plane (T) or in parallel to an imaginary tangential plane (T) of the monocentric hemispherical shell (HK) and wherein the deflecting element has an equal number of planar mutually inclined entrance surfaces when the emitting device emits laser beams, so that the at least two laser beams are each directed at the center (MP) via refraction at the entrance surfaces and exit surface when the at least two laser beams are aligned perpendicularly to the exit surface.

9. The transmitting device according to claim 5, wherein the emitting device emits at least two laser beams with parallel beam axes and the deflecting element has a planar entrance surface being arranged perpendicularly to an imaginary tangential plane (T) of the monocentric hemispherical shell (HK), the deflecting element having a rear surface and an equal number of planar mutually inclined exit surfaces when the emitting device emits laser beams, so that the at least two laser beams ($S_1, \ldots, S_n$) are reflected by the rear surface and are each directed at the center (MP) via refraction at the exit surfaces when aligned perpendicularly to the entrance surface.

10. The transmitting device according to claim 5, wherein the deflecting element is monolithically formed in the cover element.

* * * * *